United States Patent [19]
MacDougall et al.
[11] 3,895,966
[45] July 22, 1975

[54] METHOD OF MAKING INSULATED GATE FIELD EFFECT TRANSISTOR WITH CONTROLLED THRESHOLD VOLTAGE

[75] Inventors: John D. MacDougall; Kenneth E. Manchester, both of Williamstown, Mass.

[73] Assignee: Sprague Electric Company, North Adams, Mass.

[22] Filed: Sept. 30, 1969

[21] Appl. No.: 862,238

[52] U.S. Cl. .................... 148/1.5; 357/91
[51] Int. Cl. .................... H01l 7/54
[58] Field of Search .......... 317/235, 21.1, 22.2, 48; 148/1.5 X

[56] References Cited

UNITED STATES PATENTS

| | | | |
|---|---|---|---|
| 3,413,531 | 11/1968 | Leith | 317/235 |
| 3,417,464 | 12/1968 | Fang et al. | 317/235 |
| 3,514,844 | 6/1970 | Bower et al. | 317/235 |

OTHER PUBLICATIONS

Electronics "MOS Frequency Soars with Ion-implanted Layers" by Shannon, Feb. 3, 1969, pp. 96, 98, 99, 100.

*Primary Examiner*—L. Dewayne Rutledge
*Assistant Examiner*—J. M. Davis
*Attorney, Agent, or Firm*—Connolly and Hutz

[57] ABSTRACT

The threshold voltage of an IGFET is precisely controlled by the introduction of a quantity of dopants into the gate and channel region by exposure to an energetic ion beam.

5 Claims, 4 Drawing Figures

METHOD OF MAKING INSULATED GATE FIELD EFFECT TRANSISTOR WITH CONTROLLED THRESHOLD VOLTAGE

BACKGROUND OF THE INVENTION

This invention relates to an insulated gate field effect transistor (hereinafter referred to as an IGFET) and more particularly to an enhancement mode IGFET having a chosen threshold voltage established by the ion impurity concentration in the channel area between the source and drain regions.

For present day applications in insulated gate logic circuitry, enhancement type IGFET's with low threshold voltages ($V_t$) are desirable. The threshold voltage of an IGFET is that voltage which must be applied to the gate electrode in order to cause a given current, usually in the order of 10 $\mu$a, to flow from the source to the drain. Some of the advantages of field effect transistors with low threshold voltages are increased switching speed, reduced power consumption, and the ease of integration of IGFET circuitry with bipolar transistor circuits. Thus having enchancement mode IGFET's with low threshold voltages facilitates the production of new and improved digital circuits.

The threshold voltage of an IGFET may be controlled by varying the following parameters: the thickness of the gate dielectric, the dielectric constant of the gate insulator, the fixed surface state charge density within the gate insulator which is concentrated at the insulator semiconductor interface, the charge density per unit area within the surface depletion region below the gate insulator or below the conduction channel area if a conduction channel already exists, and the work function difference between the metal gate and semiconductor. Prior art methods of forming IGFET's with different threshold voltages have involved the variation of all of the previously described parameters. However practical engineering requirements over and above theoretical considerations have restricted the range over which the parameters determining the threshold voltage can be varied.

The most successful prior art methods of forming P-enhancement IGFET's with low threshold voltages have involved: the use of careful processing to reduce the fixed surface state charge density within the gate insulator which is concentrated at the insulator semiconductor interface, the variation of the work function difference between the metal gate and semiconductor by double layer gate insulators or appropriate choice of gate metal, or the use of a gate insulator with high dielectric constant. The prior art variation of the charge density per unit area within the surface depletion region below the gate insulator or below the conduction channel if a conduction channel already exists, has been restricted by practical limitations on semiconductor substrate resistivity.

It is an object of this invention to provide an enhancement mode IGFET with a low threshold voltage which can be controllably selected in the range from zero volts to approximately 8 volts.

It is another object of this invention to provide an enhancement mode IGFET for which the threshold voltage may be selected by varying the charge density per unit area within the channel region.

It is a further object of this invention to provide more than one enhancement mode IGFET on the same semiconductor wafer with each IGFET having a different threshold voltage.

SUMMARY OF THE INVENTION

At least one IGFET is formed on one semiconducting wafer with each transistor having a precisely controlled threshold voltage. The threshold voltage for each transistor is controlled by the introduction of a quantity of dopants into the gate and channel region between the source and drain of each IGFET. This introduction of dopants is accomplished by masking all other IGFET's on the semiconductor wafer and exposing the unmasked gate insulator and underlying channel to an energetic ion beam and then annealing the structure. These injected ions alter the net charge per unit area in the channel region, thereby altering the threshold voltage. The magnitude of the change in threshold voltage can be chosen by selecting the appropriate ion dose and energy.

The injection of impurity ions of the opposite conductivity type from the semiconducting wafer will lower the threshold voltage while injection of the same conductivity type ions will increase the threshold voltage. If the ion dose and energy are sufficient, the threshold voltage of the transistor may be reduced to zero and below, thereby changing the transistor from an enhancement mode device to a depletion mode device.

DESCRIPTION OF THE PREFERRED EMBODIMENTS

Figure 1:
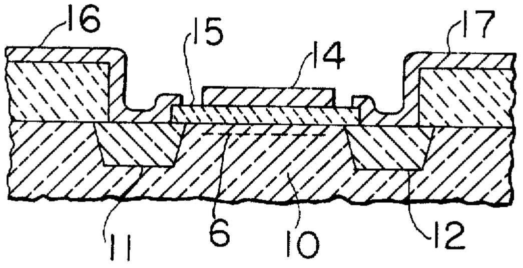
FIG. 1 shows a cross-sectional view of an IGFET.

FIG. 1 shows a cross-sectional view of a P-enhancement IGFET formed in accordance with this invention. The semiconductor substrate 10 is of N-type silicon having a conductivity of 1ω-cm. and oriented in the <111> direction. The spaced apart source region 11 and drain region 12 can be formed either by conventional diffusion or ionic implantation of P-type conductivity impurities, both techniques of which are well known in the state of the art. The source and drain regions are formed so that each has a surface in the same plane as the surface of semiconductor substrate 10 as shown in FIG. 1. The gate oxide 15 is silicon dioxide, thermally grown on the substrate surface in the region between the source and drain to a thickness of 1500 A. Conduction from source to drain would be in channel region 6. After formation of the gate oxide, but before deposition of the metal gate, the gate insulator 15 and the surface region near the underlying channel region 6, are lightly doped with P-type conductivity ions by the controlled exposure to an ion beam of $^{11}B+$ boron ions having an accelerating voltage of 50 keV. After the ion beam exposure, the semiconductor substrate is annealed at 950°C for one half hour in $N_2$ in order to heal radiation damage. Annealing temperatures in the range of (500°–1000°)C may be utilized to heal part or all of the radiation damage caused by the ion implantation. Ohmic contacts 16 and 17 from the source and drain regions respectively are next deposited by conventional techniques such as evaporation or sputtering.

The value of the threshold voltage is controlled by the ionic implantation of P-type conductivity ions which reduces the charge density per unit area within the surface depletion region below the channel region 6 as illustrated by FIG. 1. In order to better understand how a reduction in this specific charge density lowers the threshold voltage, reference should be made to the following equation. (The signs of the terms in the following equation are those for a P-enhancement device):

$$V_t = \frac{-t}{K\epsilon_o}(Q_{ss} + Q_B) + \phi_{ms}$$

The terms of the preceding equation are defined as follows:

$V_t$ = threshold voltage $t$ = thickness of the gate insulator

K = dielectric constant of the gate insulator $\epsilon_o$ = permittivity of free space $Q_{ss}$ = fixed surface state charge density within the gate insulator and concentrated at the insulator-semiconductor interface $Q_B$ = charge density per unit area within the surface depletion region below the gate insulator or below the conducting channel if a conducting channel already exists $\phi_{ms}$ = difference between the effective metal and semiconductor work functions.

As shown by the preceding equation, a reduction of $Q_B$ with all other parameters remaining constant will cause a corresponding reduction in the threshold voltage of the IGFET.

Figure 2A:
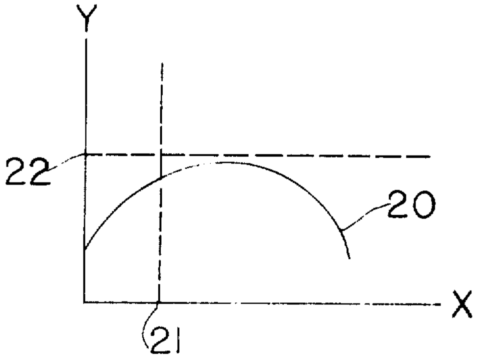
FIG. 2A is a graph illustrating how a typical ion concentration distribution varies with the depth of the implanted ions.

FIG. 2A is a graph illustrating how a typical ion concentration distribution varies with the depth of the implanted ions. The horizontal axis of the graph shows the depth of the ion implantation in angstrom units starting with zero angstrom on the left end of the axis which would correspond to the outside surface of the gate insulator. The vertical axis shows the density of ions per cubic cm. The curve illustrates a typical dopant concentration plotted against the ion penetration depth for the example illustrated in FIG. 1 which was a P-enhancement IGFET having a silicon semiconducting substrate of 1ω-cm conductivity implanted with $^{11}B+$ boron ions at 50 keV. Line 21 of FIG. 2A designates the depth of the silicon dioxide gate insulator which is 1500 A and line 22 designates the background concentration of N-type dopants in the semiconductor substrate which is approximately $5 \times 10^{15}$ ions per cubic cm. FIG. 2A shows a peak concentration of the implanted P-type conductivity dopants near the silicon dioxide-silicon interface 21 which is comparable to but less than the background concentration 22 of the N-type dopants. The P-type conductivity dopants in the N-type conductivity substrate reduce the net charge density per unit area, $Q_B$, in the channel region (6, FIG. 1) by impurity compensation, thereby forming an IGFET with a lower threshold voltage than would have resulted without the ion implant. As the peak concentration of the implanted P-type conductivity dopants approaches the background concentration of N-type dopants, the net charge density per unit area, $Q_B$, in the channel region is reduced thereby reducing the threshold voltage.

Figure 2B:
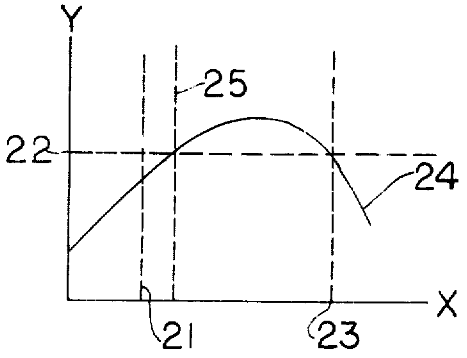
FIG. 2B is a graph illustrating an increased ion concentration which is greater than background concentration.

FIG. 2B shows the P-enhancement IGFET of FIG. 1 and FIG. 2A with an implanted peak concentration, curve 24, which is slightly greater than the background concentration 22. When the implanted peak concentration becomes sufficiently greater than the background concentration, the sign of $Q_B$ changes and becomes opposite to that of $Q_{ss}$. Lines 23 and 25 designate the positions of the P-N junctions which would be formed in the absence of the electric field due to $Q_{ss}$ and $\phi_{ms}$. If the P-type peak concentration were sufficiently increased above the background concentration, then the magnitude of $Q_B$ would also be increased so as to eventually cancel the combined effect of $Q_{ss}$ and $\phi_{ms}$. This would cause the threshold voltage to decrease to zero and eventually change sign thereby forming a depletion mode IGFET which is normally on, due to the conducting channel existing between source and drain regions. It should be recognized that the ion implantation will also have a slight effect on those parameters other than $Q_B$ which also influence the threshold voltage.

Figure 3:
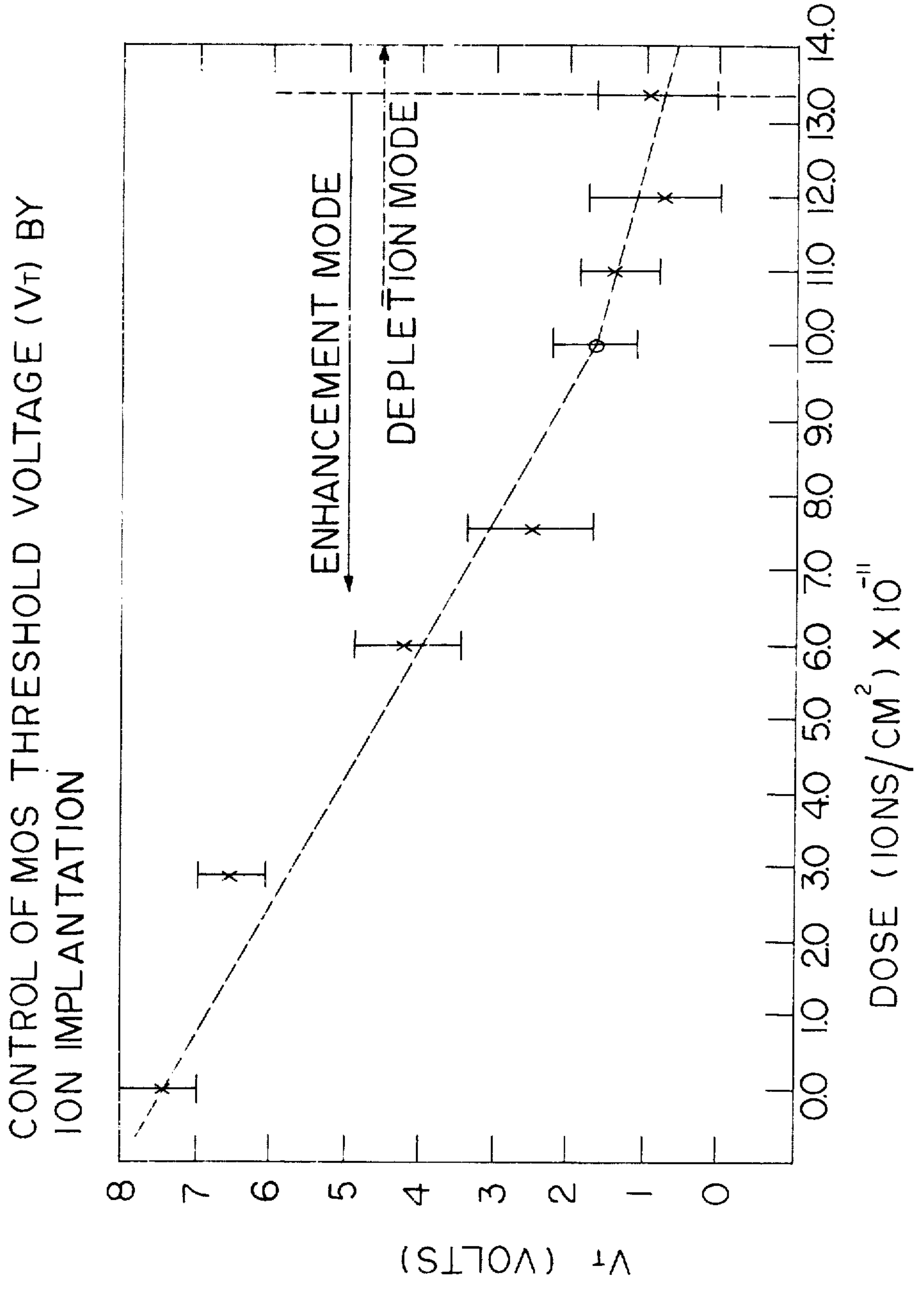
FIG. 3 is a graph showing experimental verification of the variation of threshold voltage with dopant concentration.

FIG. 3 is a graph showing experimental verification of the control of threshold voltage possible by the technique of ion implantations as previously discussed. The horizontal axis designates the dose of boron ions implanted per square cm while the verticle axis designates the different values of threshold voltages corresponding to the different ion doses implanted.

For the different IGFET structures represented in FIG. 3, the semiconducting substrate is of N-type conductivity silicon oriented in the <111> direction and having a conductivity in the range of 1 to 10ω-cm. The gate insulator is silicon dioxide in the order of 1500 A units thick and the gate metal is aluminum. The ions implanted are 50 keV $^{11}B+$ boron ions. The experimental results of FIG. 3 clearly show the continuous reduction of threshold voltage from approximately 7 volts with no implant to approximately zero volts for an implanted dose of $1.3 \times 10^{12}$ boron ions/cm$^2$. For implanted doses greater than $1.4 \times 10^{12}$ ions/cm$^2$, there will be conduction between the source and drain regions of the IGFETS's with zero voltage applied to the gate and therefore the IGFET's will function as depletion mode devices. The ion dose required to obtain a given reduced value of threshold voltage will depend upon the initial values of those other parameters which determine threshold voltage.

The previous discussion has been limited to the reduction of the threshold voltage for P-enhancement mode transistors. However the technique of ion implantation may also be used to increase the magnitude of the threshold voltage in P-enhancement devices by implanting a shallow layer of impurities of the same conductivity type as the semiconductor substrate, such as phosphorous ions into the channel region. Similarly the threshold voltage of an N-enhancement mode IGFET can also be increased or decreased by ionic implantation of boron or phosphorous ions respectively.

Another embodiment of this invention would be more than one IGFET located on the same wafer with each IGFET having precisely controlled, but different values of threshold voltage. These IGFET's could be either enhancement mode devices with different threshold voltages or both enhancement and depletion mode devices. The different threshold voltage values for the different IGFET's on the same wafer are produced by the use of a simple mask such as a metal mask which enables different transistors to receive different implanted doses.

A further embodiment of this invention is its application to complementary enhancement type IGFET pairs fabricated on the same wafer. One difficulty in the successful formation of complementary IGFET's is that of obtaining similar values of threshold voltage for both the N-enhancement and P-enhancement transistors. Either one or both of the threshold voltages of the complementary pair could be modified to produce matched transistor pairs by the ion implantation technique of this invention.

Since it is obvious that many changes and modifications can be made in the above-described details without departing from the nature and spirit of the invention, it is to be understood that the invention is not limited to said details except as set forth in the appended claims.

What is claimed is:

1. A method of making at least one IGFET on one semiconducting wafer with precisely controlled threshold voltages for each IGFET formed, including the steps of:

a. doping a semiconducting substrate to form at least one pair of spaced apart souce and drain regions within said substrate and of opposite conductivity type from said substrate;

b. forming an insulating layer on said substrate surface between said source and drain region of each IGFET, and a fixed surface state charge density within the insulating layer and concentrated at the layer substrate interface;

c. subsequently introducing at about room temperature a controlled quantity of dopants into the gate and channel region between said source and drain of selected IGFET's through said insulating layer by masking other devices on said substrate and exposing each unmasked insulator and underlying channel to an energetic ion beam to produce in the channel an implanted doping layer having at least one concentration of ion beam implanted impurity ions, whereby the charge density per unit area within an active channel region is modified and a specific threshold or pinch-off voltage is provided;

d. annealing the structure;

e. depositing a metallic gate over said implanted layer and metallic contacts to said source and drain.

2. The method of claim 1 wherein said controlled quantity of dopants in each said channel region is greater than the quantity of dopants in said insulating layer and the total quantity of dopants is precisely divided between channel and insulating layer.

3. The method of claim 1 wherein said dopants are of opposite conductivity type from said substrate and said controlled quantity produces an enhancement mode transistor having a threshold voltage of reduced magnitude.

4. The method of claim 1 wherein said dopants are of opposite conductivity type from said substrate and said controlled quantity produces a depletion mode transistor having a specific value of pinch-off voltage.

5. The method of claim 1 wherein the semiconducting substrate consists of silicon and the insulating layer consists of silicon dioxide.

* * * * *

UNITED STATES PATENT OFFICE
CERTIFICATE OF CORRECTION

Patent No. 3,895,966 Dated July 22, 1975

Inventor(s) John D. MacDougall et al.

It is certified that error appears in the above-identified patent and that said Letters Patent are hereby corrected as shown below:

Cover page, under [56] References Cited, the following U.S. patent should be listed:

-- 3,653,978 4/1972 Robinson et al... 148/1.5 --.

Column 5, line 29, "souce" should read -- source --.

Signed and Sealed this

*twenty-fourth* Day of *February 1976*

[SEAL]

*Attest:*

RUTH C. MASON
*Attesting Officer*

C. MARSHALL DANN
*Commissioner of Patents and Trademarks*